United States Patent
Kanazawa et al.

[11] Patent Number: 5,880,601
[45] Date of Patent: Mar. 9, 1999

[54] SIGNAL RECEIVING CIRCUIT AND DIGITAL SIGNAL PROCESSING SYSTEM

[75] Inventors: Nobuaki Kanazawa; Masao Mizukami, both of Yokohama; Kunihiro Ito, Ome, all of Japan

[73] Assignees: Hitachi, Ltd., Tokyo; Hitachi Communication Systems, Inc., Kanagawa, both of Japan

[21] Appl. No.: 750,581

[22] PCT Filed: May 25, 1995

[86] PCT No.: PCT/JP95/01001

§ 371 Date: Feb. 27, 1997

§ 102(e) Date: Feb. 27, 1997

[87] PCT Pub. No.: WO95/34954

PCT Pub. Date: Dec. 21, 1995

[30] Foreign Application Priority Data

Jun. 13, 1994 [JP] Japan ..................................... 6-154169

[51] Int. Cl.⁶ ............................................... H03K 19/094
[52] U.S. Cl. .................... 326/68; 326/73; 326/71
[58] Field of Search ............................. 326/70, 71, 73, 326/74, 68, 83

[56] References Cited

U.S. PATENT DOCUMENTS

| | | | |
|---|---|---|---|
| 4,996,443 | 2/1991 | Tateno | 326/68 |
| 5,153,465 | 10/1992 | Sandhu | 326/68 |
| 5,204,557 | 4/1993 | Nguyen | 326/68 |
| 5,486,785 | 1/1996 | Blankenship | 326/68 |
| 5,617,045 | 4/1997 | Asahina | 326/68 |
| 5,698,993 | 12/1997 | Chow | 326/81 |
| 5,781,026 | 6/1998 | Chow | 326/68 |

Primary Examiner—Michael Tokar
Assistant Examiner—Richard Roseen
Attorney, Agent, or Firm—Fay,Sharpe,Beall,Fagan,Minnich & McKee

[57] ABSTRACT

A signal receiving circuit comprising a first P-channel MOSFET amplifier and a first N-channel MOSFET amplifier having gates supplied with positive signals from a pair of signal transmission lines; and a second P-channel MOSFET amplifier and a second N-channel MOSFET amplifier having gates supplied with negative signals from said pair of signal transmission lines; wherein a first output signal is formed by so adjusting the gains of the first P-channel MOSFET amplifier and of the second N-channel MOSFET amplifier that the resultant signals have an intermediate amplitude between the operation voltages, and a second output signal is formed by so adjusting the gains of the second P-channel MOSFET amplifier and of the first N-channel MOSFET amplifier that the resultant signals have an intermediate amplitude between the operation voltages. This makes it possible to receive various small signals lying over a wide range even by using a sense amplifier which has only a fixed operation range in the signal receiving circuit as well as to constitute a novel and optimum system by combining semiconductor integrated circuit devices having different low-amplitude interfaces.

6 Claims, 5 Drawing Sheets

SIGNAL RECEIVING CIRCUIT AND DIGITAL SIGNAL PROCESSING SYSTEM

TECHNICAL FIELD

The present invention relates to a signal receiving circuit and to a digital signal processing system and, particularly, to technology that can be effectively utilized for transferring signals between semiconductor integrated circuit devices having different operation voltages and different types of internal logic circuits.

BACKGROUND ART

In some digital integrated circuits, small signals such as of the ECL level are transmitted based upon a power source voltage VCC such as GTL (gunning transceiver logic) or +5 V in order to transmit signals at high speeds over a signal transmission line and to decrease the consumption of electric power. The GTL has been disclosed in ISSCC, International Solid State Circuit Conference, Feb. 19, 1992, pp. 58–59.

DISCLOSURE OF THE INVENTION

As described above, there are various kinds of low-amplitude interfaces having their own features. Therefore, they will never be uniformalized into a single kind of low-amplitude interface but rather it is quite probable that new amplitude interfaces will be developed in the future. Under such circumstances where there exist various kinds of low-amplitude interfaces being mixed together, it becomes necessary to design receiving circuits of semiconductor integrated circuit devices to meet the interfaces. The present inventors therefore have devised a signal receiving circuit that can be adapted to various kinds of low-amplitude interfaces to constitute an optimum system which includes semiconductor integrated circuit devices having various interfaces in a mixed manner.

The object of the present invention therefore is to provide a signal receiving circuit capable of being adapted to various kinds of low-amplitude interfaces as well as to provide a novel digital signal processing system which permits the inclusion of various kinds of low-amplitude interfaces.

The above-mentioned and other objects as well as novel features of the present invention will become obvious from the description of the specification and the accompanying drawings.

Among the inventions disclosed in this application, a representative example will now be briefly described below. That is, the invention employs a first P-channel MOSFET amplifier and a first N-channel MOSFET amplifier having gates supplied with positive signals from a pair of signal transmission lines, and a second P-channel MOSFET amplifier and a second N-channel MOSFET amplifier having gates supplied with negative signals from said pair of signal transmission lines, and forms a first output signal is formed by so adjusting the gains of the first P-channel MOSFET amplifier and of the second N-channel MOSFET amplifier that the resultant signals have an intermediate amplitude between the operation voltages, and forms a second output signal by so adjusting the gains of the second P-channel MOSFET amplifier and of the first N-channel MOSFET amplifier that the resultant signals have an intermediate amplitude between the operation voltages, making it possible to receive various small signals lying over a wide range even by using a sense amplifier which has only a fixed operation range based upon the level-shifting actions of only said two MOSFET amplifiers and load MOSFETs.

Moreover, complementary digital output signals having different levels are sent onto a pair of first and second signal transmission lines and are received by a first (second) receiving circuit which comprises a first (third) P-channel MOSFET amplifier and a first (third) N-channel MOSFET amplifier having gates supplied with positive signals; a second (fourth) P-channel MOSFET amplifier and a second (fourth) N-channel MOSFET amplifier having gate supplied with negative signals, said first (second) receiving circuit forming a first (third) output signal by so adjusting the gains of the first (third) P-channel MOSFET amplifier and of the second (fourth) N-channel MOSFET amplifier that the resultant signals have an intermediate amplitude between the operation voltages and forming a second (fourth) output signal by so adjusting the gains of said second (fourth) P-channel MOSFET amplifier and a first (third) N-channel MOSFET amplifier that the resultant signals have an intermediate amplitude between the operation voltages, making it possible to constitute a novel and optimum system by combining semiconductor integrated circuit devices having different low-amplitude interfaces.

BEST MODE FOR CARRYING OUT THE INVENTION

The invention will now be described in detail in conjunction with the accompanying drawings.

Figure 1:
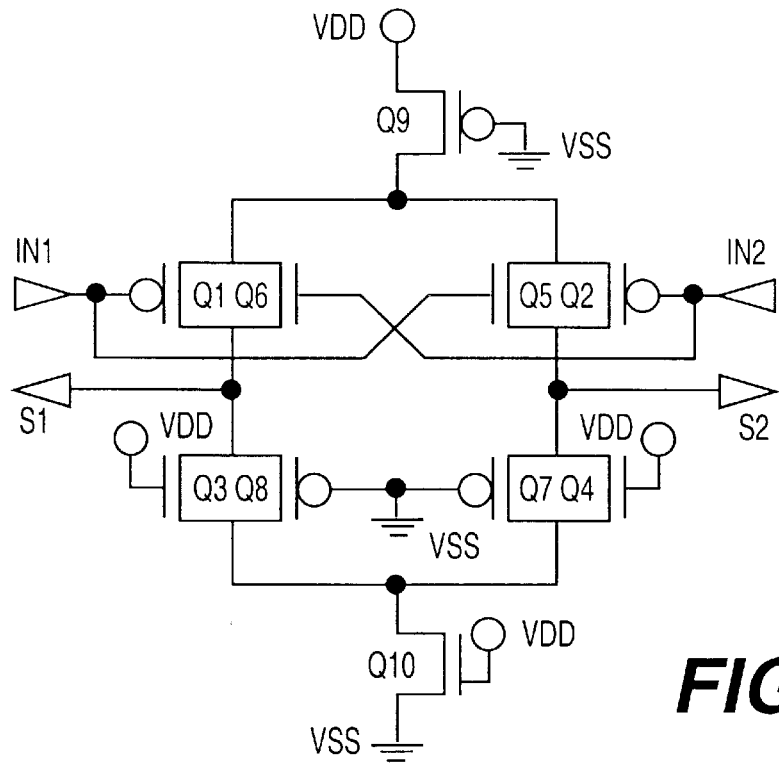
FIG. 1 is a diagram illustrating an embodiment of a preferred level-shifting circuit used for a signal receiving circuit of the present invention.

FIG. 1 is a circuit diagram illustrating an embodiment of a level-shifting circuit used for a signal receiving circuit of the present invention. In FIG. 1, the circuit elements are formed on a semiconductor substrate, such as a single-crystal silicon substrate, together with other circuits constituting a digital signal processor by a known semiconductor integrated circuit process. In FIG. 1, MOSFET means an insulated-gate field-effect transistor (IGFET), and a P-channel MOSFET is marked with a circle at the gate to distinguish it from an N-channel MOSFET.

Input terminals IN1 and IN2 receive complementary digital signals consisting of a positive signal and a negative signal of a small amplitude. One input terminal IN1 is connected to the gate of a P-channel MOSFET amplifier Q1 and to the gate of an N-channel MOSFET amplifier Q5. The other input terminal IN2 is connected to the gate of a P-channel MOSFET amplifier Q2 and to the gate of an N-channel MOSFET amplifier Q6. The P-channel MOSFET amplifiers Q1 and Q2 have sources in common and are connected in a differential manner and are further provided at the drains thereof with N-channel load MOSFETs Q3 and Q4.

With their gates kept at a power-source voltage VDD, these load MOSFETs Q3 and Q4 work as resistor elements. The N-channel MOSFET amplifiers Q5 and Q6 are connected at the drains thereof to the sources of the P-channel MOSFET amplifiers Q1 and Q2, and are provided at the sources thereof with P-channel load MOSFETs Q7 and Q8. With their gates kept at a ground potential VSS of the circuit, the load MOSFETs Q7 and Q8 serve as resistor elements.

The P-channel MOSFET amplifiers Q1, Q2 and the N-channel load MOSFETs Q3, Q4 constitute a differential amplifier circuit which inverts the input signal. On the other hand, the N-channel MOSFET amplifiers Q5, Q6 and the P-channel load MOSFETs Q7, Q8 constitute a source follower amplifier circuit. Therefore, the source of the N-channel MOSFET amplifier Q5 that forms an output signal in phase with the input signal IN1 of the positive phase, is connected in common with the drain of the P-channel MOSFET amplifier Q2 that inverts and amplifies the input signal IN2 of the negative phase, and produces an output signal S2. Conversely, the source of the N-channel MOSFET amplifier Q6 that forms an output signal of the same phase as the input signal IN2 of the negative phase, is connected in common with the drain of the P-channel MOSFET amplifier Q1 that inverts and amplifies the input signal IN1 of the positive phase, and produces an output signal S1.

A P-channel MOSFET Q9 is connected to the junction between the common source and common drain of the P-channel MOSFET amplifiers Q1, Q2 and of the N-channel MOSFET amplifiers Q6, Q5, and the P-channel MOSFET Q9 acts as a current source with a gate connected to the ground potential VSS of the circuit. Similarly, an N-channel MOSFET Q10 is connected to the junction between the common source and common drain of the N-channel load MOSFETs Q3, Q4 and of the P-channel load MOSFETs Q8, Q7, and the N-channel MOSFET Q10 acts as a current source with a gate connected to the power source VDD.

The MOSFETs Q1 to Q10 have sizes as described below. The channel lengths L are all equal, i.e., 0.8 μm. The P-channel MOSFET amplifiers Q1 and Q2 have a channel width W which is relatively as large as 20 μn, and the corresponding N-channel load MOSFETs Q3 and Q4 have a channel width W which is relatively as small as 5 μn. Similarly, the N-channel MOSFET amplifiers Q5 and Q6 have a channel width W which is relatively as large as 15 μn, and the corresponding P-channel load MOSFETs Q7 and Q8 have a channel width W which is relatively as small as 10 μn.

As is well known, here, when they have the same size, the N-channel MOSFETs have a large conductance. Therefore, the ratio of sizes of the P-channel load MOSFETs Q7, Q8 to the N-channel MOSFET amplifiers Q5, Q6 decreases and the ratio of sizes of the N-channel load MOSFETs Q3, Q5 to the P-channel MOSFET amplifiers Q1, Q2 increases. In terms of the conductance ratio of the load MOSFETs to the MOSFET amplifiers, however, they have nearly the same size.

The P-channel MOSFET Q9 which is a current source has a channel width of 30μ and the N-channel MOSFET Q10 has a channel width of 20μ. That is, the two MOSFETs Q9 and Q10 are so formed as to flow the same current. When the N-channel MOSFET is based upon, the P-channel MOSFET has a size which is about 1.5 times as great.

The ratio of sizes of the P-channel MOSFET amplifier Q1 corresponding to the positive input IN1 to the N-channel load MOSFET Q3 is 20:5 as described above, which, however, can be converted into a conductance ratio of about 20:7.5=1:0.375. The ratio of sizes of the N-channel MOSFET amplifier Q6 to the P-channel load MOSFET Q8 is 15:10 as described above, which, however, can be converted into a conductance ratio of 22.5:10=1:0.444. This quite holds true even for the other amplifier circuit corresponding to the negative input IN2.

Figure 3:
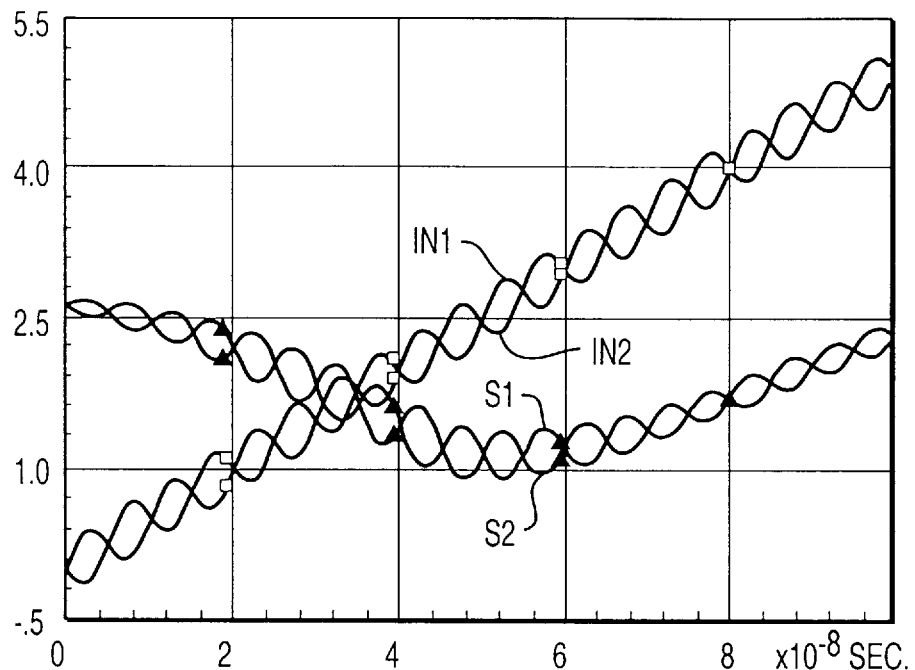
FIG. 3 is a diagram of input/output characteristics for explaining the level-shifting circuit according to the present invention.

The above-mentioned two amplifier circuits are arranged in parallel for the output signals S1 and S2. As shown in FIG. 3 which is a diagram of input and output characteristics, therefore, the level can be shifted while aggregating the output signals S1 and S2 within a narrow range of from 1 V to 2.5 V even when the input signals IN1 and IN2 are small signals lying over a wide range of from the ground potential VSS of the circuit to the power-source voltage VDD of about 5 V.

When the two amplifier circuits are resultant for the input signals IN1 and IN2 as described above, the resultant output signals S1 and S2 are in a predetermined narrow voltage range on account of the following reasons. When the input signals IN1 and IN2 lie in a low voltage region such as of ground potential of the circuit, neither the N-channel MOSFET amplifier Q5 nor Q6 is allowed to operate or, even if they operate, the voltage across the gate and the source is so small that the dynamic conductance of the MOSFET amplifiers is small. In this case, the greatest voltage has been applied between the gate and the source of the P-channel MOSFET amplifiers Q1 and Q2, and a large dynamic conductance is exhibited. Therefore, an inverting amplifier circuit made up of the P-channel MOSFET amplifiers Q1 and Q2 works dominantly for the small signals in a low-voltage region such as of ground potential of the circuit, and the level of the output signal is shifted to nearly an intermediate voltage such as about 2.5 V.

On the other hand, when the input signals IN1 and IN2 lie in a high-voltage region such as of the power-source voltage VDD, neither the P-channel MOSFET amplifier Q1 nor Q2 operates, or even if they operate, the voltage between the gate and the source is so small that the MOSFET amplifiers exhibit a small dynamic conductance. In this case, the greatest voltage has been applied between the gate and the source of the N-channel MOSFET amplifier Q1, and a large dynamic conductance is exhibited. Therefore, the source follower amplifier circuit made up of the N-channel MOSFET amplifiers Q5 and Q6 works dominantly for the small signals in the high-voltage region such as of the power source voltage VDD, and the levels of the output signals S1 and S2 are shifted to an intermediate voltage such as about 2.5 V in response to the conductance ratio of the load MOSFETs Q6 and Q8.

When the input signals IN1 and IN2 are nearly at the intermediate voltage, the two amplifier circuits compensate one another to form resultant output signals S1 and S2. Therefore, the output level becomes such that the voltage range becomes the lowest near the intermediate voltage. As described above, even when the small input signals IN1 and IN2 lie over a wide range of from near ground potential of the circuit to the power-source voltage, the level-shifting circuit of this embodiment exhibits a novel level-shifting function to bring the output signals into a narrow range of from about 1 V to about 2.5 V.

Figure 4:
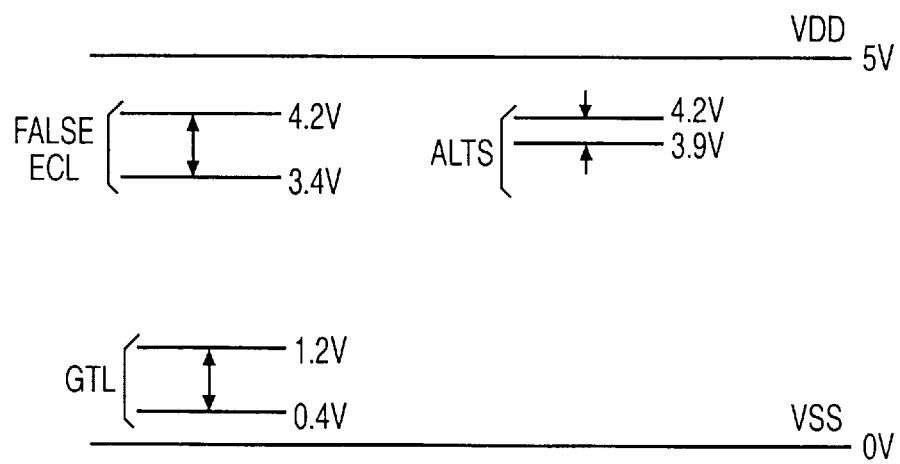
FIG. 4 is a diagram of level settings for explaining a low-amplitude interface to which the present invention can be adapted.

Referring to FIG. 4, the levels can be shifted to about 2 V as described above for a false ECL signal having a high level of 4.2 V and a low level of 3.4 V, for a GTL signal having a high level of 1.2 V and a low level of 0.4 V or for an ALTS signal having a high level of 4.2 V and a low level of 3.9 V proposed already by the present inventors based upon a power-source voltage VDD of, for example +5 V instead of ground potential of 0 V in the conventional circuits. The same also holds for the signals such as LVTTL, etc.

Even when the input signals IN1, IN2 have various levels depending upon the interfaces as described above, the output signals S1 and S2 can be within a predetermined voltage range. This means that the signals can be received by using a sense amplifier consisting of a fixed circuit which is used for the semiconductor memories, etc. That is, there is no need to design a signal receiving circuit to meet each of the signal amplitudes in a system. Instead, the semiconductor integrated circuit device can be provided with a circuit for receiving various input signals provided the input signals are complementary signals.

Figure 2:
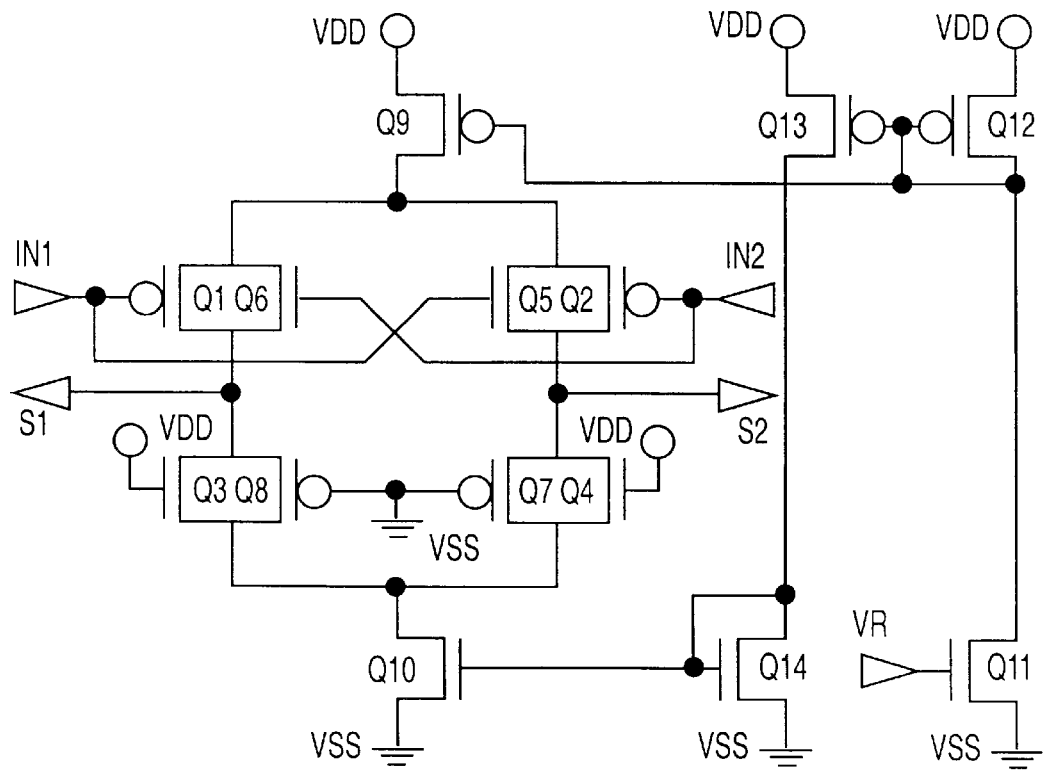
FIG. 2 is a diagram illustrating another embodiment of the preferred level-shifting circuit used for the signal receiving circuit of the present invention.

FIG. 2 is a circuit diagram illustrating another embodiment of the level-shifting circuit used for the signal receiving circuit of the present invention. In this embodiment, the current source of the amplifier circuit is formed by a current mirror circuit. That is, a constant voltage VR is applied across the gate and the source of a MOSFET Q11 to form a constant current which is allowed to flow into a diode-connected P-channel MOSFET Q12. The gate of the MOSFET Q12 and the source of the MOSFET Q9 are connected in common to constitute a current mirror circuit, and the constant current is permitted to flow into the MOSFET Q9.

The MOSFET Q12 is provided with a MOSFET Q13 in the form of a current mirror which is connected to a diode-connected N-channel MOSFET Q14. The gate of the MOSFET Q14 and the source of the MOSFET Q10 are connected in common to constitute a current mirror circuit, and the above-mentioned constant current is permitted to flow into the MOSFET Q10. The constitution in other respects is the same as that of the embodiment of FIG. 1, and is not described.

In this embodiment, the operation current of the amplifier circuit is formed based upon a constant current obtained based upon the constant voltage VR. Therefore, the current that flows into the amplifier circuit is stabilized, and a desired level-shifting operation is stably carried out.

Figure 5:
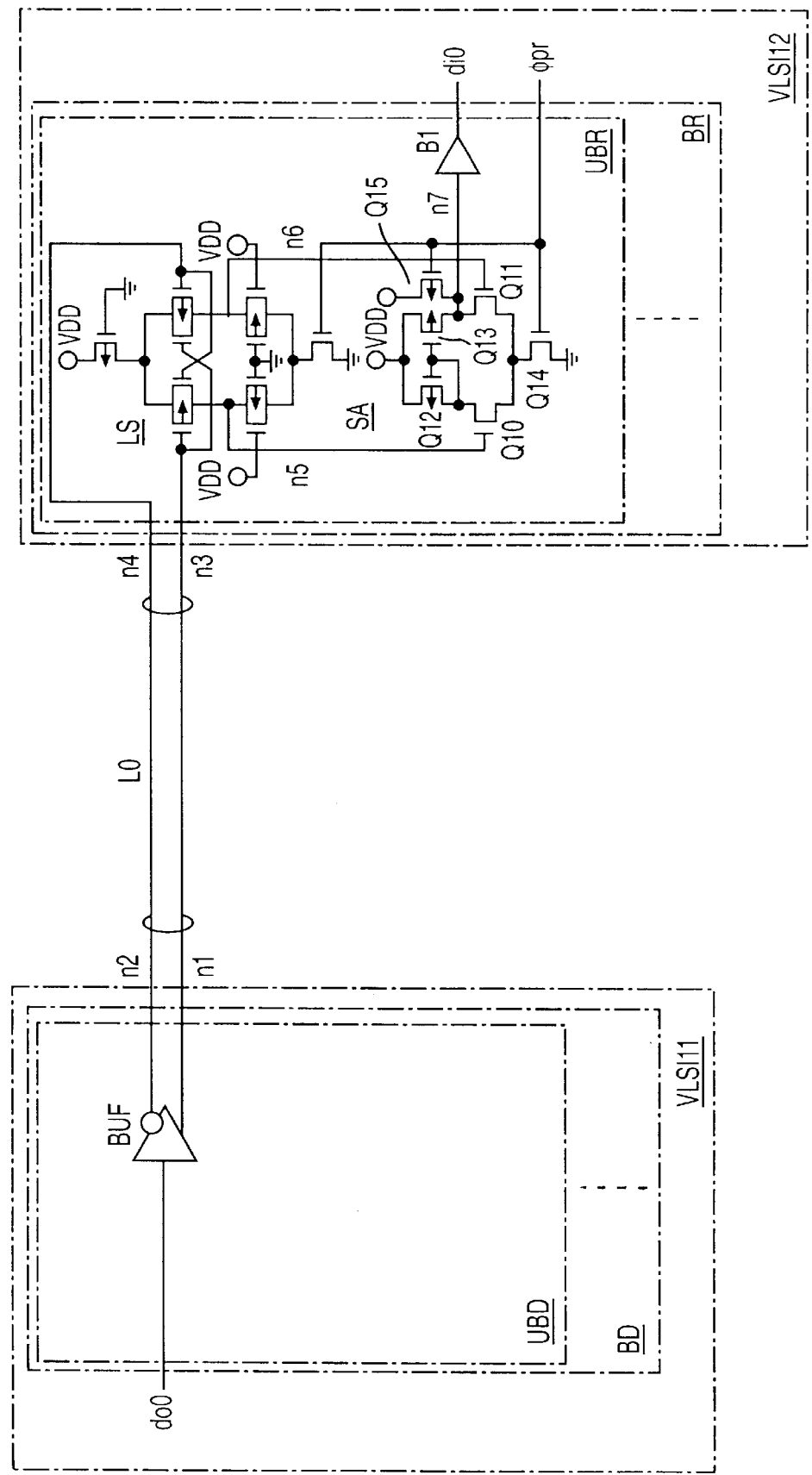
FIG. 5 is a partial block diagram illustrating an embodiment of a preferred digital signal processor of the present invention.

FIG. 5 is a block diagram illustrating a portion of an embodiment of a preferred digital signal processor according to the present invention. The digital signal processor of this embodiment is included in an overall digital communication network, i.e., in an ATK (asynchronous transfer mode) switch-board of ISDN (integrated services digital network system). Though there is no particular limitation, the digital signal processor includes many electronic circuit packages mounted on one or a plurality of racks, and a plurality of semiconductor integrated circuit devices (LSIs) mounted on these electronic circuit packages are connected together via a transmission line. Though the symbols attached to the MOSFETs constituting the signal receiving circuit UBR are partly overlapping those of FIG. 1 or 2, it should be noted that these elements have separate circuit functions.

Though there is no particular limitation in this embodiment, the electronic circuit package constituting the digital signal processor is fabricated based upon a CMOS or bipolar CMOS circuit or a false ECL circuit to meet the required functions. That is, when the operation speed is not required, a high degree of integration and decreased power consumption are realized by using the CMOS circuit. When an intermediate degree of speed is required, the bipolar CMOS circuit is used and when a high-speed operation is required, the false ECL circuit is used. By combining a variety of semiconductor integrated circuit devices to meet the individual circuit functions, the digital signal processor as a whole features a high-speed operation, a high degree of integration and a decreased power consumption.

FIG. 5 representatively illustrate a transmitter circuit UBD and a receiving circuit IBR in two large-scale integrated circuit devices VLSI11 and VLSI12 in an electronic circuit package constituting the digital signal processor. That is, there are shown a unit transmitter circuit UBD in a signal transmitter circuit BD mounted on the large-scale integrated circuit device VLSI11 and a unit receiving circuit UBR in a signal receiving circuit BR mounted on the large-scale integrated circuit device VLSI12.

The large-scale integrated circuit device VLSI11 comprises the signal transmitter circuit BD made up of a plurality of unit transmission circuits UBD, a signal processing circuit (not shown) and, as required, the following signal receiving circuit for receiving signals from other large-scale integrated circuit devices. The large-scale integrated circuit device VLSI12 comprises the signal receiving circuit BR made up of a plurality of unit receiving circuits UBR, a signal processing circuit (not shown) and, as required, the above-mentioned signal transmitter circuit for transmitting signals to other large-scale integrated circuit devices.

The unit transmitter circuit UBD provided in the large-scale integrated circuit device LSI11 is constituted by a transmission buffer BUF for receiving a signal do0 formed by an internal circuit. The internal signal do0 is formed by a logic circuit such as the CMOS or bipolar CMOS circuit or false ECL circuit, and assumes a signal level corresponding to the circuit. The transmission buffer BUF outputs, from an output node n1, an output signal corresponding to the internal signal do0 and outputs, from an output node n2, a signal having a phase opposite thereto.

A pair of signals from the output nodes n1 and n2 are transmitted to input nodes n3 and n4 of the large-scale integrated circuit device LSI12 through a pair of signal transmission lines. In the above-mentioned GTL interface, the unit transmission circuit UBD is constituted by an open-drain output MOSFET which, when activated, executes complementary switching operation for the signal do0. Terminal resistors are connected between the terminals of the two signal transmission lines and the terminal voltage to be in match with the impedance of the transmission lines. When the output interface is the false ECL circuit, a signal of a false ECL level is output. To accomplish high-speed operation and low power consumption, the signal levels transmitted through the signal transmission lines are transformed into small signals as exemplified in FIG. 4.

The unit receiving circuit UBR provided in the large-scale integrated circuit device LSI12 is constituted by a level-shifting circuit LS and a sense amplifier SA which utilizes a differential amplifier circuit for receiving level-shifted outputs n5 and n6 as shown in FIG. 1. The level-shifting circuit LS was described above in detail with reference to FIG. 1, and is not described here again. The level-shifting circuit LS works to automatically bring small input signals lying over a wide range into a narrow voltage range of from about 1 V to about 2.5 V.

Since the level-shifted outputs n5 and n6 are within a voltage range of from about 1 V to about 2.5 V as described above, the sense amplifier SA is formed of N-channel differential MOSFETs Q10, Q11, P-channel load MOSFETs Q12, Q13 in the form of a current mirror, and current-source MOSFET Q14 connected to common sources of the N-channel differential MOSFETs Q10, Q11 having such sizes that the sensitivity becomes a maximum within the above-mentioned voltage range.

The sense amplifier SA amplifies the level-shifted input signals and outputs, from an output node n7, output signals of a high level and a low level nearly corresponding to the operation voltage. With a differential signal being input, no reference voltage is required. Besides, the sense amplifier SA is little affected by fluctuation in the processing, since properties of a pair of differential elements formed in the integrated circuit have similarly been fluctuated through the production processing, and is capable of canceling common-mode noise and maintains sufficient degree of operation margin. The output signal of the sense amplifier SA is taken by an internal circuit that is not shown as a reception signal di0 having a CMOS level through the output buffer B1.

In this embodiment, the level-shifting circuit LS is provided with a power switch MOSFET which is controlled by a control signal φpr together with the current-source MOSFET Q14 in the sense amplifier SA so that no direct current will be wasted in the modes other than the signal reception mode. That is, with the signal φpr being set to the low level, the power switch MOSFET in the level-shifting circuit LS and the current-source MOSFET Q14 in the sense amplifier are turned off to prevent current from flowing in these circuits.

In order that the output signal of the sense amplifier SA will not assume an indefinite level when it is not in operation, a P-channel MOSFET Q15 is provided between the output node n7 of the sense amplifier SA and the power-source voltage VDD, and the control signal φpr is fed to the gate thereof. When the sense amplifier SA is not in operation, therefore, the P-channel MOSFET Q15 is turned on, and the output node n7 of the sense amplifier SA is forcibly set to the high level. When the sense amplifier SA is not in operation, therefore, the reception signal di0 output through the output buffer B1 is set to the high level.

When the internal circuit of the semiconductor integrated circuit device LSI12 is constituted by the false ECL circuit, the output buffer B1 is provided with a level conversion function for conversion into a false ECL level. Or, the level may be converted into the false ECL level after it has been converted into the CMOS level by the CMOS inverter circuit. As described above, the output signal of the sense amplifier SA is converted for its level so as to be adapted to the logic form of the internal circuit in the semiconductor integrated circuit device on which the sense amplifier SA is mounted.

Figure 6:
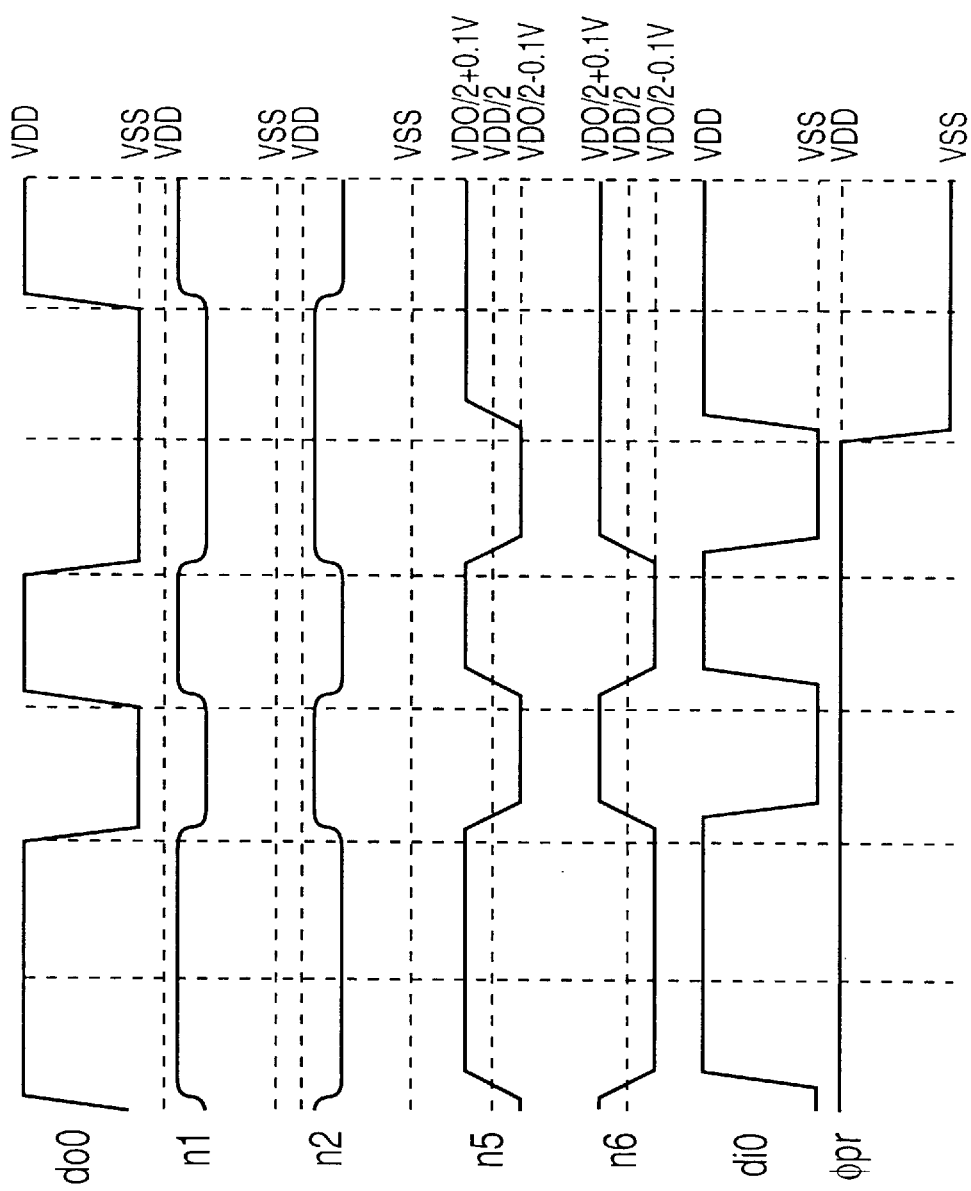
FIG. 6 is a diagram of waveforms for explaining the operation of the circuit of the embodiment shown in FIG. 5.

FIG. 6 is a diagram of waveforms for explaining the operation of the circuit of FIG. 5. On the transmission side, small signals that change complementarily appear at the output nodes n1 and n2 depending upon the high level and the low level of the internal signals do0. The signals are transmitted at low levels that change on the side of the power-source voltage VDD such as the false ECL level or the ALTS level as shown in FIG. 4.

On the receiving side, the control signal φpr has the high level, and the level-shifting circuit LS and the sense amplifier SA are in operation. In the level-shifting circuit LS, a low level such as ALTS deviated toward the side of the power-source voltage VDD is shifted to near the intermediate voltage like VDD/2, and is shifted for its level maintaining a small amplitude such as +0.1 V and −0.1 V about VDD/2. The sense amplifier SA amplifies the level-shifted small signal and forms, through the output buffer B1, a reception signal di0 of the CMOS level having a high level such as the power-source voltage VDD and a low level such as ground potential VSS of the circuit.

When the receiving operation is finished on the receiving side, the control signal φpr assumes the low level. This interrupts the operation current of the level-shifting circuit LS and the sense amplifier SA, and causes the P-channel MOSFET at the output portion of the sense amplifier SA to be turned on, so that the output signal is fixed to the high level. Therefore, the output signal di0 of the output buffer B1 assumes the high level, too.

Figure 7:
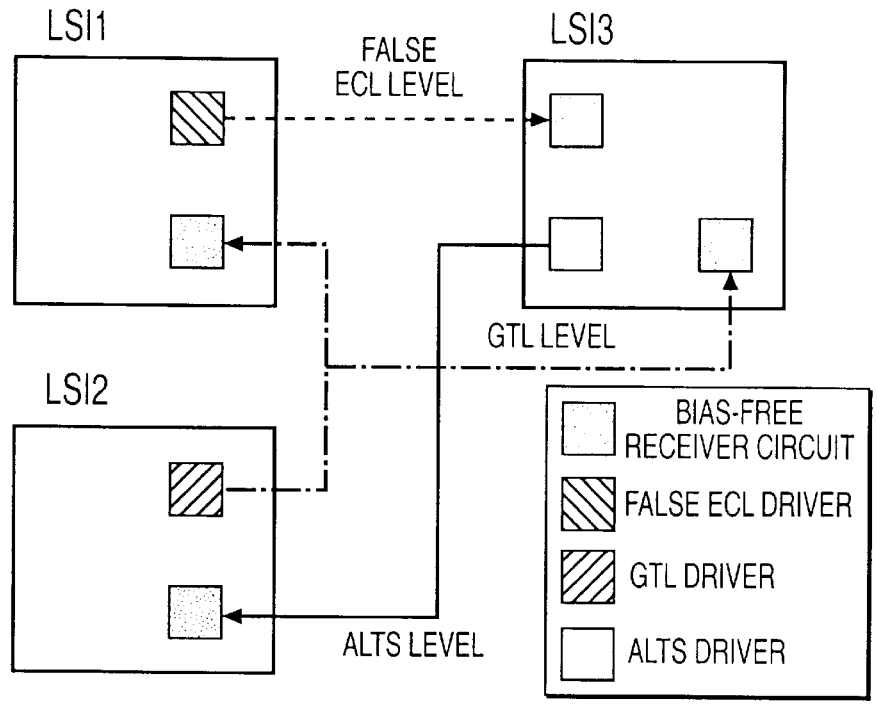
FIG. 7 is a block diagram schematically illustrating an embodiment of a preferred digital data processing system according to the present invention.

FIG. 7 is a block diagram schematically illustrating an embodiment of a digital data processing system according to the present invention. In this embodiment, three large-scale integrated circuits LSI1 to LSI3 are representatively shown.

The large-scale integrated circuit LSI1 processes the digital signals through a false ECL circuit. Therefore, an output signal of the false ECL level is transmitted as a transmission signal from the large-scale integrated circuit LSI1 to the large-scale integrated circuit LSI3. The large-scale integrated circuit LSI3 processes the digital signals through the CMOS circuit. Therefore, a bias-free receiving circuit using the signal receiving circuit of the present invention effects the conversion into the reception signal and the CMOS level.

The large-scale integrated circuit LSI2 processes the digital signals through the CMOS circuit. However, the signal is output to the large-scale integrated circuit LSI1 from the GTL circuit. Accordingly, the above-mentioned bias-free circuit is used as the receiving circuit in the large-scale integrated circuit LSI1, and a level converter circuit is provided at the output portion to convert the level into the false ECL level. The GTL signal formed by the large-scale integrated circuit LSI1 is also transmitted to the large-scale integrated circuit LSI3. The large-scale integrated circuit LSI3 processes the digital signals through the same CMOS circuit as that of the large-scale integrated circuit LSI2 but has different output interfaces like GTL and ALTS. In order to exchange the signals between the large-scale integrated circuits LSI2 and LSI3, therefore, the transmission and reception are effected at different signal levels by using the bias-free circuit.

When the digital signal processing is effected by using the same CMOS circuit or the bipolar CMOS circuit, it is desired that the circuit is uniformized like GTL or ALTS. For this purpose, however, the large-scale integrated circuit must be designed to meet the individual interfaces. According to the present invention, the receiving circuit includes the above-mentioned bias-free circuit making it possible to exchange signals to and from large-scale integrated circuits having any signal level. Therefore, an integrated circuit can be newly designed and developed to meet the functions; i.e., the existing semiconductor integrated circuits having particular low-amplitude interfaces can be resultant together to constitute a digital signal processing system. This makes it possible to enhance the efficiency for mass-producing the semiconductor integrated circuit devices having a variety of low-amplitude interfaces and to form an ideal digital signal processing system.

Figure 8:
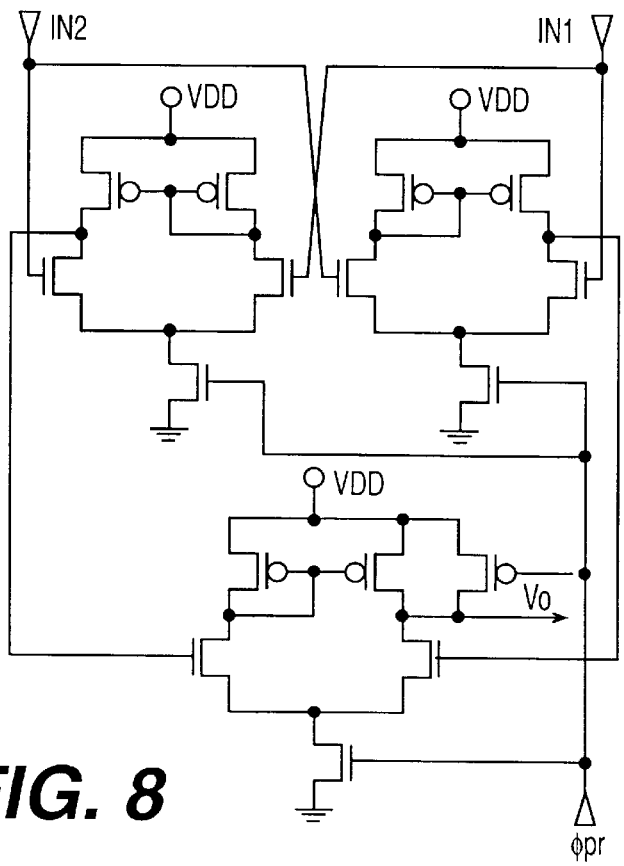
FIG. 8 is a circuit diagram illustrating another embodiment of a preferred sense amplifier used for the signal receiving circuit of the present invention.

FIG. 8 is a circuit diagram illustrating another embodiment of the sense amplifier used for the signal receiving circuit according to the present invention. This embodiment employs a double-balanced differential sense amplifier in order to increase the gain for the small input signals like ALTS. That is, by using two single-ended differential sense amplifiers as shown in FIG. 5, the input signals IN1 and IN2 are so supplied that the output signals will have phases opposite to each other, and complementary output signals of the two single-ended differential sense amplifiers are fed to a differential amplifier circuit in the output stage.

In order to prevent a direct current from flowing into the sense amplifier in the modes other than the signal reception mode, the current-source MOSFET for forming an operation current in each differential circuit is turned off by the control signal φpr. In this case, in order to prevent the output signal from assuming an indefinite level, the output unit is provided with the P-channel MOSFET which is controlled by the control signal φpr to fix the output node to the high level.

Described below are the actions and effects exhibited by the above-mentioned embodiment.

The invention employs a first P-channel amplifier MOSFET and a first N-channel amplifier MOSFET having gates supplied with positive signals from a pair of signal transmission lines, and a second P-channel MOSFET amplifier and a second N-channel MOSFET amplifier having gates supplied with negative signals from said pair of signal transmission lines, and forms a first output signal by so adjusting the gains of the first P-channel MOSFET amplifier and of the second N-channel MOSFET amplifier that the resultant signals have an intermediate amplitude between the operation voltages, and forms a second output signal by so adjusting the gains of the second P-channel MOSFET amplifier and of the first N-channel MOSFET amplifier that the resultant signals have an intermediate amplitude between the operation voltages, making it possible to receive various small signals lying over a wide range even by using a sense amplifier which has only a fixed operation range.

Moreover, complementary digital output signals having different levels are sent onto a pair of first and second signal transmission lines and are received by a first (second) receiving circuit which comprises a first (third) P-channel MOSFET amplifier and a first (third) N-channel MOSFET amplifier having gates supplied with positive signals; a second (fourth) P-channel MOSFET amplifier and a second (fourth) N-channel MOSFET amplifier having gate supplied with negative signals, said first (second) receiving circuit forming a first (third) output signal by so adjusting the gains of the first (third) P-channel MOSFET amplifier and of the second (fourth) N-channel MOSFET amplifier that the resultant signals have an intermediate amplitude between the operation voltages and forming a second (fourth) output signal by so adjusting the gains of said second (fourth) P-channel MOSFET amplifier and a first (third) N-channel MOSFET amplifier that the resultant signals have an intermediate amplitude between the operation voltages, making it possible to constitute a novel and optimum system by combining semiconductor integrated circuit devices having different low-amplitude interfaces.

A first output signal and a second output signal of the signal receiving circuit are fed to a differential sense amplifier and are converted into digital signals. Therefore, common-mode noise is canceled without requiring a reference voltage, making it possible to maintain a sufficiently large operation margin.

By using the signal receiving circuit for the input circuit of the digital integrated circuit, it is allowed to form a semiconductor integrated circuit device that can be adapted to a variety of low-amplitude interfaces, contributing to enhancing the mass-production efficiency.

The low-amplitude interfaces may take a variety of forms. The signal receiving circuit is mounted on a large-scale integrated circuit or may, by itself, be constituted by a semiconductor integrated circuit device. In the CMOS integrated circuit, for instance, efforts have been made to lower the operation voltage to be about 3 V. In the existing CMOS circuits or the false ECL circuits, on the other hand, use is made of a power-source voltage of 5 V. Hence, the receiving circuit must use a voltage which is relatively as large as 5 V. Therefore, the signal receiving circuit may be fabricated as a semiconductor integrated circuit device that operates on 5 V and may be used as a buffer, in order to feed the output signal to a semiconductor integrated circuit device which operates on a law voltage such as 3 V.

When the receiving circuit is mounted on a large-scale integrated circuit and when the internal circuit must be operated on a low voltage such as 3 V, the internal circuit may include a voltage-lowering circuit to lower the voltage of the internal CMOS circuit down to about 3 V, while receiving 5 V from an external unit. Or, two power-source voltages, e.g., 5 V and about 3 V may be supplied through the external terminals. In an integrated circuit of the bipolar CMOS constitution, the output element of the GTL interface may be a bipolar transistor. The load MOSFET used for the level-shifting circuit may be replaced by a resistor element.

The large-scale integrated circuit may be provided with a signal transmitter circuit and a signal receiving circuit. That is, a large-scale integrated circuit is constituted for each of the functional blocks, and the signal receiving circuit of the invention is utilized for transmitting the signals among the blocks.

Industrial Applicability

As described above, the signal receiving circuit and the digital signal processing system of the present invention can be extensively used for a variety of signal receiving circuits and digital signal processing systems such as digital switchboard systems, high-speed computers, etc.

We claim:

1. A signal receiving circuit comprising:
   a first P-channel MOSFET amplifier and a first N-channel MOSFET amplifier having gates supplied with positive signals from a pair of signal transmission lines; and
   a second P-channel amplifier MOSFET and a second N-channel MOSFET amplifier having gates supplied with negative signals from said pair of signal transmission lines; wherein
   a first output signal is formed by commonly using the outputs of the first P-channel MOSFET amplifier and of the second N-channel MOSFET amplifier and by so adjusting the gains thereof that the resultant signals have an intermediate amplitude between the operation voltages; and
   a second output signal is formed by commonly using the outputs of the second P-channel MOSFET amplifier and of the first N-channel MOSFET amplifier and by so adjusting the gains thereof that the resultant signals have an intermediate amplitude between the operation voltages.

2. A signal receiving circuit according to claim 1, wherein the first output signal and the second output signal of said signal receiving circuit are fed to a differential sense amplifier and are converted into digital signals.

3. A signal receiving circuit according to claim 1, wherein said signal receiving circuit is used for an input circuit of a digital integrated circuit.

4. A signal receiving circuit according to claim 2, wherein said signal receiving circuit is used for an input circuit of a digital integrated circuit.

5. A digital signal processing system comprising:

first and second semiconductor integrated circuit devices each including a signal transmission circuit that sends complementary digital output signals of different levels onto a pair of first and second signal transmission lines; and a third semiconductor integrated circuit device comprising:

a first signal receiving circuit which includes:

a first P-channel MOSFET amplifier and a first N-channel MOSFET amplifier having gates supplied with positive signals from said pair of first signal transmission lines; and a second P-channel MOSFET amplifier and a second N-channel MOSFET amplifier having gates supplied with negative signals from said pair of first signal transmission lines;

said first signal receiving circuit forming a first output signal by commonly using the outputs of the first P-channel MOSFET amplifier and of the second N-channel MOSFET amplifier and by so adjusting the gains thereof that the resultant signals have an intermediate amplitude between the operation voltages, and a second output signal by commonly using the outputs of the second P-channel MOSFET amplifier and of the first N-channel MOSFET amplifier and by so adjusting the gains thereof that the resultant signals have an intermediate amplitude between the operation voltages;

a first differential sense amplifier which receives the output signals from said signal receiving circuit and converts them into digital signals;

a second signal receiving circuit which includes:

a third P-channel MOSFET amplifier and a third N-channel MOSFET amplifier having gates supplied with positive signals from said pair of second signal transmission lines; and a fourth P-channel MOSFET amplifier and a fourth N-channel MOSFET amplifier having gates supplied with negative signals from said pair of second signal transmission lines;

said second signal receiving circuit forming a third output signal by commonly using the outputs of the third P-channel MOSFET amplifier and of the fourth N-channel MOSFET amplifier and by so adjusting the gains thereof that the resultant signals have an intermediate amplitude between the operation voltages, and a fourth output signal by commonly using the outputs of the fourth P-channel MOSFET amplifier and of the third N-channel MOSFET amplifier and by so adjusting the gains thereof that the resultant signals have an intermediate amplitude between the operation voltages; and a second differential sense amplifier which receives the output signals from said signal receiving circuit and converts them into digital signals.

6. A digital signal processing system according to claim 5, wherein said first and second semiconductor integrated circuit devices include internal logic circuits of different types.

* * * * *

UNITED STATES PATENT AND TRADEMARK OFFICE
CERTIFICATE OF CORRECTION

PATENT NO. : 5,880,601
DATED : Mar. 9, 1999
INVENTOR(S) : Nobuaki Kanazawa, et al It is certified that error appears in the above-indentified patent and that said Letters Patent is hereby corrected as shown below:

IN THE CLAIMS

Please amend claim 1 as set forth below.

Column 10, Claim 1: A signal receiving circuit comprising:
first P-channel MOSFET amplifier and a first N-channel MOSFET amplifier having gates supplied with positive signals from a pair of signal transmission lines; and
a second P-channel MOSFET amplifier and a second N-channel MOSFET amplifier having gates supplied with negative signals from said pair of signal transmission lines; wherein
a first output signal is formed by commonly using the outputs of the first P-channel MOSFET amplifier and of the second N-channel MOSFET amplifier and by so adjusting the gains thereof that the resultant signals have an intermediate amplitude between [the] operation voltages; and
a second output signal is formed by commonly using the outputs of the second P-channel MOSFET amplifier and of the first N-channel MOSFET amplifier and by so adjusting the gains thereof that the resultant signals have an intermediate amplitude between the operation voltages.

Signed and Sealed this

Fifth Day of October, 1999

*Attest:*

Q. TODD DICKINSON

*Attesting Officer*     *Acting Commissioner of Patents and Trademarks*